March 14, 1972 G. SANJIV KAMATH 3,649,384
PROCESS FOR FABRICATING SILICON CARBIDE JUNCTION DIODES BY LIQUID PHASE EPITAXIAL GROWTH
Filed March 27, 1969
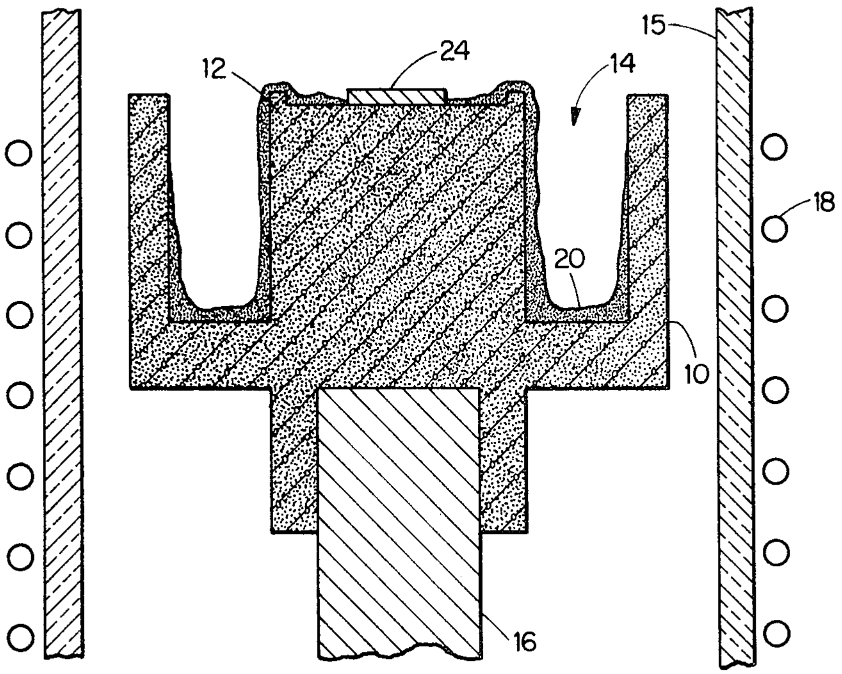

United States Patent Office 3,649,384
Patented Mar. 14, 1972

3,649,384

PROCESS FOR FABRICATING SILICON CARBIDE JUNCTION DIODES BY LIQUID PHASE EPITAXIAL GROWTH

G. Sanjiv Kamath, Wellesley, Mass., assignor to Norton Research Corporation, Cambridge, Mass.

Continuation-in-part of application Ser. No. 624,896, Mar. 21, 1967, and a continuation-in-part of application Ser. No. 659,690, Aug. 10, 1967. This application Mar. 27, 1969, Ser. No. 810,977
Int. Cl. H01l *7/38;* H05b *33/00;* C01b *31/36*
U.S. Cl. 148—171 5 Claims

ABSTRACT OF THE DISCLOSURE

The production of electroluminescent silicon carbide junction diodes having low forward resistance is described. These diodes are produced by doping an epitaxially grown layer containing boron as a major impurity with a minor quantity of aluminum.

This invention relates to novel silicon carbide junction diodes, particularly light-emitting diodes, and the novel method of manufacturing such diodes. The method involves liquid phase epitaxial growth and requires a temperature gradient between the base crystal and the molten solution.

SUMMARY OF THE INVENTION

This application is in part a continuation of my copending application Ser. No. 624,896, filed Mar. 21, 1967, now abandoned and in part a continuation of my copending application Ser. No. 659,690, filed Aug. 10, 1967, now abandoned.

The invention is particularly concerned with silicon carbide junction diodes and their production wherein the light-emitting junction is formed on an n-type crystal by growing a p-type layer on the surface of the crystal. In the copending application of Vitkus, Ser. No. 589,363, filed Oct. 25, 1966, such a diode is formed by the epitaxial growth of silicon carbide on an n-type base crystal, the epitaxial growth being accomplished from a solution containing silicon carbide and a major "p" type impurity such as boron. The resulting p-n junction has good optical efficiency and produces a bright yellow light. However, the power efficiency is relatively poor since the resistance of the regrown layer is quite high in the forward direction.

Accordingly, it is a principal object of the invention to provide a method for producing diodes of the above type having a much lower forward resistance without affecting the quantum efficiency of the diodes.

Another object of the present invention is to provide an improved method for growing a boron-doped silicon carbide p-n junction having good power efficiency.

These and other objects of the invention will in part be obvious and will in part appear hereinafter.

For a fuller understanding of the nature and objects of the invention, reference should be had to the following detailed description thereof taken in connection with the accompanying drawing in which The figure is a diagrammatic, schematic representation of one embodiment of the invention.

In the general practice of the present invention, the silicon carbide junction is prepared by starting with a single crystal of silicon carbide having an "n" impurity type and growing a layer of silicon carbide containing a "p" impurity type on one surface of the base crystal. The starting material is an n-type silicon carbide crystal having a relatively high concentration of nitrogen, for example, and is green and translucent to visible light. The regrown p-type layer, having a relatively high concentration of boron will have a rather dark color and be quite opaque to visible light. However, the plane of the junction and the area immediately adjacent the junction in the n layer is sufficiently transparent to the generated light so that the light can escape from the edge of the diode. In order that the forward resistance of the diode can be lowered, as mentioned above, a small quantity of aluminum is added as an impurity during the boron doping process. When a boron-doped layer is grown, there is an impurity concentration on the order of $10^{18}$ to $10^{20}$ boron atoms per cubic cm. in silicon carbide. It can be demonstrated by calculation that the total hole concentration available for electrical conduction in compensated boron doped silicon carbide is on the order of $10^{14}$ per cubic cm. This appears to be about the concentration obtained in the growth process described hereinafter wherein silicon is used as the solvent and boron is the major "p" type impurity. This concentration of boron in the grown layer is lower than that in the more heavily doped silicon melt, presumably due to the influence of the segregation coefficient for boron under the conditions of the experiment as well as due to the competing reactions of boron with the carbon and silicon. The number of carriers in the p layer is further reduced by compensation of the boron by nitrogen which is generally present in the growth system due to leaks, impurity nitride formation, and other reasons inherent in the growth system. The low carrier concentration in the boron doped p layer is believed to cause the high resistivity.

Addition of aluminum as a codopant with boron drastically reduces the forward resistance of the diode. There are believed to be two explanations for this effect of aluminum. First, it has a shallower impurity level in the silicon carbide band gap and hence a greater degree of ionization at room temperature. As a result, if one introduces on the order of $10^{19}$ aluminum atoms/cm.$^3$ as a codopant with boron, it could give rise to $10^{15}$ to $10^{16}$ holes/cm.$^3$. This means that for an aluminum concentration level about one-tenth that of boron, the carrier concentration would increase enough to reduce the forward resistance by a factor of ten; for a typical diode made by the process described in Example 1, this would mean reduction of resistance from 500 ohms to 50 or 100 ohms for a diode .9 mm. x .9 mm. x .9 mm.

A second way in which aluminum can help is by acting as a nitrogen getter in the growth ambient. It has been mentioned above that the presence of donors in the crystal introduced by nitrogen tends to favor compensation of the acceptors caused by boron and thus reduces both the number and the percentage ionization of the uncompensated boron levels thus reducing the charge carriers produced by boron. If aluminum does form the nitride, the nitrogen is effectively removed from an electrically active state in the p layer. Accordingly, the increased uncompensated boron will ionize to a greater degree, thus reducing the forward resistance of the diode. Both these ways in which aluminum can function are complementary and produce a diode with lower resistance.

With a relatively low level of codoping with aluminum, there is no adverse effect upon the quantum efficiency of the p-n junction. While a further increase in the amount of aluminum as a codopant in the diode can further decrease the forward resistance of the p-n junction, it may have an adverse effect upon the light efficiency as well as the frequency of the emitted radiation. This is due to the fact that the aluminum concentration, if it becomes comparable with the boron concentration, may act as a competing impurity level for optical transition and will also increase the absorption coefficient. Accordingly, while higher aluminum doping in the diode can be desirable for uses where light emission is not critical, it must be avoided when electroluminescent efficiency is the desirable quality. In general, the ratio of aluminum to boron in the silicon melt will depend upon the temperature of the growth reaction. At a relatively low temperature (of about 1900° C.), the ratio of aluminum to boron in the silicon melt should be between about 1/100 and about 1/10. Due to the difference in the segregation coefficient and the vapor pressures of boron and aluminum at higher growth temperatures, however, an increase in growth temperature will permit (and call for) an increasing ratio of aluminum to boron in the silicon. Thus, at 2100° C., aluminum and boron should be in a ratio of about 1:1 on a weight basis.

In order that the invention may be more fully understood, reference should be had to the figure and to the following nonlimiting examples:

EXAMPLE 1

A small graphite crucible 10 was constructed from high purity graphite (less than 5 p.p.m. ash) obtained from the Ultra Carbon Corporation. The crucible had the general shape shown in the figure. The pedestal 12 was about 7/16" in diameter and the groove 14 was about 3/8" deep. It was supported inside of a quartz tube 15 about 15" long and 1¼" in diameter by a carbon rod 16 about 8" long. On the outside of the tube 15 was positioned an induction coil 18 energized by a 10 kw. radio frequency generator.

The crucible was outgassed at 1500° C. for 10 minutes in hydrogen, flushed for 5 minutes in helium, then the temperature was increased to 1900° C. on top of the pedestal for 10 minutes. The system was then cooled and the crucible removed. One gram of silicon 20 was placed in the groove 14 with 20 mg. of pure crystalline boron and 1 mg. of aluminum. The test crystal 24 containing 220 parts per million nitrogen was placed on top of the pedestal. The bottom surface of the crystal had been polished with ¼ micron diamond paste. Resistivity of the crystal was approximately .05Ω cm. and the mobility approximately 70 $cm.^2$/V-sec.

The crucible, with the crystal, was then replaced in the quartz tube 15. The crucible temperature was raised to 1300° C. in hydrogen for 10 minutes. The tube then was flushed with helium for five minutes. After flushing the helium gas flow was controlled at 1 cu. ft./hr. and the temperature raised to 1900° C. (on the surface of the crystal) for ¾ of an hour. The system was then cooled and the crystal removed from the crucible.

It was then processed in the following manner:

(1) The top surface of the crystal was ground to remove a dark layer which had grown on this top surface.

(2) The crystal was then contacted on both sides with a pure silver contact using $TiH_2$ as a flux in a helium atmosphere at 1000° C.

(3) The crystal was then trimmed to a small cube (.9 mm. on edge).

(4) Two sides were polished.

The quantum efficiency of light emanating from the diode was determined with a photomultiplier tube. In this case the quantum efficiency is calculated as the number of photons out divided by the number of electrons passing through the diode. The output of photons per second is found by measuring the light output of the diode with a photomultiplier using the published tube data, and the input of electrons per second is found by measuring the diode current and using the relationship $$1 \text{ amp.} = 6.81 \times 10^{18} \text{ electrons per second}$$

The final diced diode had an "n" section which was translucent green, the p-n junction had a regrown region about .0020" thick. When this diode was biased in the forward direction, it emitted strong yellow light having quantum efficiency of about $5 \times 10^{-6}$ in a narrow flat beam emanating from the junction. The diode had a forward resistance of 100 ohms, whereas a diode formed under identical conditions without the added aluminum had a forward resistance of about 500 ohms.

In the above experiment, the regrown p layer is believed to have been formed by wetting action of the silicon on the carbon pedestal, this silicon containing the dissolved "p" type impurity (e.g. boron containing a minor amount of aluminum). This wetting may be accompanied with the formation of considerable silicon carbide at the interface between the molten silicon and the carbon of the pedestal. In any case, it appears that silicon creeps between the lower face of the silicon carbide crystal and the upper face of the pedestal. A layer of molten silicon thus exists between a lower carbon (or silicon carbide) surface and a somewhat cooler upper silicon carbide surface. Under these conditions reaction of carbon at the lower (hotter boundary) of the liquid layer takes place and a silicon carbide solution in silicon results. Deposition of silicon carbide at the upper (colder) boundary follows and under the appropriate temperature gradient an epitaxial layer of silicon carbide grows on the substrate crystal. Since the growing silicon carbide comes from a silicon containing a high concentration of the p type impurity, the growing silicon carbide layer is a "p" type layer.

EXAMPLE 2

In this case the procedure was generally the same as in Example 1 except that (a) The crucible was pretreated with silicon at about 1900° C. to impregnate the internal surfaces with silicon carbide;

(b) The growth temperature was 2100° C. as measured on the top of the crystal, and (c) The aluminum concentration (by weight) was the same as the boron concentration in the silicon at the start of the run. Also the time the system was held at temperature (2100° C.) was much less, i.e. about 7 minutes.

In other respects the treatment was the same as in Example 1. However, in this case the resistance of the diode was reduced to less than 50 ohms for a diode .9 mm. x .9 mm. x .9 mm. This corresponds to a resistivity of about 100 ohm cm. if the resistance is assumed to be all in the p layer and the p layer is assumed to be .05 mm. thick.

From the above discussion, it is apparent that the growth temperature, the temperature gradient in the vicinity of the crystal and the concentration of nitrogen at the growing interface all have a significant influence on the characteristics of the grown junction and will affect its resistance. What must be accomplished is to add sufficient aluminum to provide adequate aluminum in the vicinity of the growing p layer to preferentially tie up the nitrogen present in the growing p layer and also add some charge carriers in addition to those supplied by the boron. The only upper limit on the aluminum concentration is that it should be about equal to or less than the boron concentration in the p layer, otherwise there will be an interference with the optical transitions due to the boron impurity and the quantum efficiency of the light from the diode will decrease.

Since certain changes can be made in the above process without departing from the scope of the invention herein involved, it is intended that all matter contained in the above description shall be interpreted as illustrative and not in a limiting sense.

What is claimed is:

1. In the method of growing a p-type silicon carbide epitaxial layer on an "n" type silicon carbide base crystal to provide a p-n junction wherein said base crystal is placed on a carbon support and is heated to an elevated temperature in the vicinity of about 1900° C. while said carbon support is wet by silicon, there being a temperature gradient between said base crystal and said carbon support with said carbon support being hotter, said silicon containing an appreciable concentration of boron as a "p" type impurity, the improvement which comprises adding aluminum to the silicon as a codopant, the amount of aluminum present being adjusted in accordance with its vapor pressure and segregation coefficient so that, at the temperature of growth, about ten times as much boron as aluminum will be incorporated in the epitaxial layer.

2. The method of claim 1 wherein the aluminum concentration in the silicon is less than about 1/10 the boron concentration.

3. In the method of growing a p-type silicon carbide epitaxial layer on an "n" type silicon carbide base crystal to provide a p-n junction wherein said base crystal is placed on a carbon support and is heated to an elevated temperature of about 1900° C. while said carbon support is wet by silicon, there being a temperature gradient between said base crystal and said carbon support with said carbon support being hotter, said silicon containing an appreciable concentration of boron as a "p" type impurity, the improvement which comprises adding aluminum to the silicon as a codopant, the aluminum concentration being less than 1/10 the boron concentration.

4. In the method of growing a p-type silicon carbide epiaxial layer on an "n" type silicon carbide base crystal to provide a p-n junction wherein said base crystal is placed on a carbon support and is heated to an elevated temperature of about 2100° C. while said carbon support is wet by silicon, there being a temperature gradient between said base crystal and said carbon support with said carbon support being hotter, said silicon containing an appreciable concentration of boron as a "p" type impurity, the improvement which comprises adding aluminum to the silicon as a codopant, the aluminum concentration being about equal to the boron concentration.

5. In the method of growing a p-type silicon carbide epitaxial layer on an "n" type silicon carbide base crystal to provide a p-n junction wherein said base crystal is placed on a carbon support and is heated to an elevated temperature in the vicinity of about 2100° C. while said carbon support is wet by silicon, there being a temperature gradient between said base crystal and said carbon support with said carbon support being hotter, said silicon containing an appreciable concentration of boron as a "p" type impurity, the improvement which comprises adding aluminum to the silicon as a codopant, the amount of aluminum present being adjusted in accordance with its vapor pressure and segregation coefficient so that, at the temperature of growth, the aluminum concentration in the silicon is about equal to the boron concentration.

References Cited

UNITED STATES PATENTS

| | | | |
|---|---|---|---|
| 3,205,101 | 9/1965 | Mlavsky et al. | 148—171 |
| 3,360,406 | 12/1967 | Sumski | 148—1.6 |
| 3,458,779 | 7/1969 | Blank et al. | 317—234 |
| 3,462,321 | 8/1969 | Vitkus | 148—172 |

OTHER REFERENCES

Patrick, Lyle: "Structure and Characteristics of Silicon Carbide Light-Emitting Junctions," J. of Applied Physics, vol. 28, No. 7, July 1957, pp. 765–776.

L. DEWAYNE RUTLEDGE, Primary Examiner

W. G. SABA, Assistant Examiner

U.S. Cl. X.R.

23—208, 301; 117—201; 148—1.6, 172, 173, 177; 317—234, 235 N